United States Patent
Saraswat et al.

(10) Patent No.: US 7,248,066 B2
(45) Date of Patent: Jul. 24, 2007

(54) ON-CHIP ANALYSIS AND COMPUTATION OF TRANSITION BEHAVIOR OF EMBEDDED NETS IN INTEGRATED CIRCUITS

(75) Inventors: Ruchir Saraswat, Vasundhara Ghaziabad (IN); Balwant Singh, Greater Noida (IN); Prashant Dubey, Ghaziabad (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 0 days.

(21) Appl. No.: 11/025,854

(22) Filed: Dec. 29, 2004

(65) Prior Publication Data

US 2005/0174102 A1  Aug. 11, 2005

(30) Foreign Application Priority Data

Dec. 29, 2003  (IN) .................. 1629/DEL/2003

(51) Int. Cl.
G01R 31/28 (2006.01)
G01R 27/28 (2006.01)
G01R 19/00 (2006.01)

(52) U.S. Cl. .................. 324/763; 324/765; 324/158.1; 324/102; 702/117

(58) Field of Classification Search ................ 324/102, 324/763–765
See application file for complete search history.

(56) References Cited

U.S. PATENT DOCUMENTS

| 4,161,029 | A | * | 7/1979 | Frye et al. ................... 702/117 |
| 4,607,214 | A | * | 8/1986 | Welzhofer ................. 324/72.5 |
| 5,173,906 | A | * | 12/1992 | Dreibelbis et al. .......... 714/733 |
| 5,528,137 | A | * | 6/1996 | Riggio, Jr. ............... 324/158.1 |
| 6,182,257 | B1 | * | 1/2001 | Gillingham ................. 714/733 |
| 6,369,601 | B1 | * | 4/2002 | Ishigaki ...................... 324/765 |
| 6,424,583 | B1 | * | 7/2002 | Sung et al. ................. 365/201 |
| 6,978,411 | B2 | * | 12/2005 | Huang et al. ............... 714/733 |

* cited by examiner

*Primary Examiner*—Ha Tran Nguyen
*Assistant Examiner*—Emily Y Chan

(57) ABSTRACT

An apparatus for enabling the on-chip analysis of the voltage and/or current transition behaviour of one or more embedded nets of an integrated circuit independently of the fabrication process. The said apparatus comprises a Reference Step Generator (RSG) for providing programmable reference voltages or currents, a Step Delay Generator (SDG) for providing programmable delays, a Comparator (C) that receives the output of the reference step generator on one input, the output from the node under test at the second input, and a latch enable signal from the step delay generator, and provides a latched digital output in response to the comparison, and a controller that co-ordinates the operation of the reference step generator, Step Delay Generator and Latching Comparator to provide a transient response measurement.

20 Claims, 5 Drawing Sheets

US 7,248,066 B2

ON-CHIP ANALYSIS AND COMPUTATION OF TRANSITION BEHAVIOR OF EMBEDDED NETS IN INTEGRATED CIRCUITS

TECHNICAL FIELD OF THE INVENTION

This invention relates to integrated circuits and their testing, debugging and characterization. In particular, this invention relates to the testing and characterization of embedded nets in integrated circuits.

BACKGROUND OF THE INVENTION

The testing of integrated circuits presents many challenges owing to the extremely small dimensions of the circuit elements and the nets connecting them. The problem is further aggravated by the fact that several of the internal nets and nodes of the circuit are embedded in inner layers of the interconnect. The transient response of internal circuit nets is an important parameter in analyzing the transient behaviour of the circuit. The measurement of the transient response requires the measurement of the voltage at the selected node at various instants of time in response to a step change in applied voltage at a selected point in the circuit.

At present, the voltage at any embedded net is probed using:

An ebeam machine. This method suffers from the following limitations:
Absolute Voltage Measurement is not possible
Nets need to propogate until Top metal.
Cannot be used for a large number of nets owing to excessive m/c setup time and manual effort requirements.

Tapping the node to a pad and then probing with an oscilloscope. This method also suffers from the following limitations:

Probing the internal node and bringing it to the pad is costly as it changes the inherent charateristic of the net and disturbs its electrical behaviour.
It is often not possible to bring the net outside due to either layout density or pad limitations.
This technique needs extra pads/Machine setup.

A methodology is therefore needed to probe embedded nets. Such a methodology would be immensely useful in designing/testing/debugging/characterization of a time dependent design. Such methodology will also be helpful in providing a correlation between simulation and Silicon, which will aid model development.

SUMMARY OF THE INVENTION

To address the above-discussed deficiencies of the prior art, an object of this invention is to provide a device and method for monitoring the transient behaviour of the internal nets of an integrated circuit.

To achieve the said objective, this invention provides an apparatus for enabling the on-chip analysis of the voltage and/or current transition behaviour of one or more embedded nets of an integrated circuit independently of the fabrication process, comprising:

a Reference Step Generator (RSG) for providing programmable reference voltages or currents,
a Step Delay Generator (SDG) for providing programmable delays,
a Comparator (C) that receives the output of the reference step generator on one input, the output from the node under test at the second input, and a latch enable signal from the step delay generator, and provides a latched digital output in response to the comparison, and
a controller that coordinates the operation of the reference step generator, Step Delay Generator and Latching Comparator to provide a transient response measurement.

The above apparatus further comprises an on-chip delay characterizer.

The Reference Step Generator is a programmable voltage/current source.

The Comparator is a differential amplifier.

The stepped delay generator is a balanced buffer chain.

The on-chip delay is characterized by a ring counter.

The present invention also provides a method for measuring the voltage and/or current transient response of an embedded net in an integrated circuit independently of the fabrication process comprising the steps of:

generating a Reference voltage/current,
generating programmable Step Delays,
comparing the output from the circuit under test with the programmed reference voltage/current,
latching the output of the comparison, and
coordinating the operations of the reference voltage/current generation, Step Delay Generation, comparison and Latching of the Comparator to provide a transient response measurement.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular apparatus or controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be explained with reference to the accompanying drawings, in which like reference numerals represent like parts, in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figures 1A, 1B:
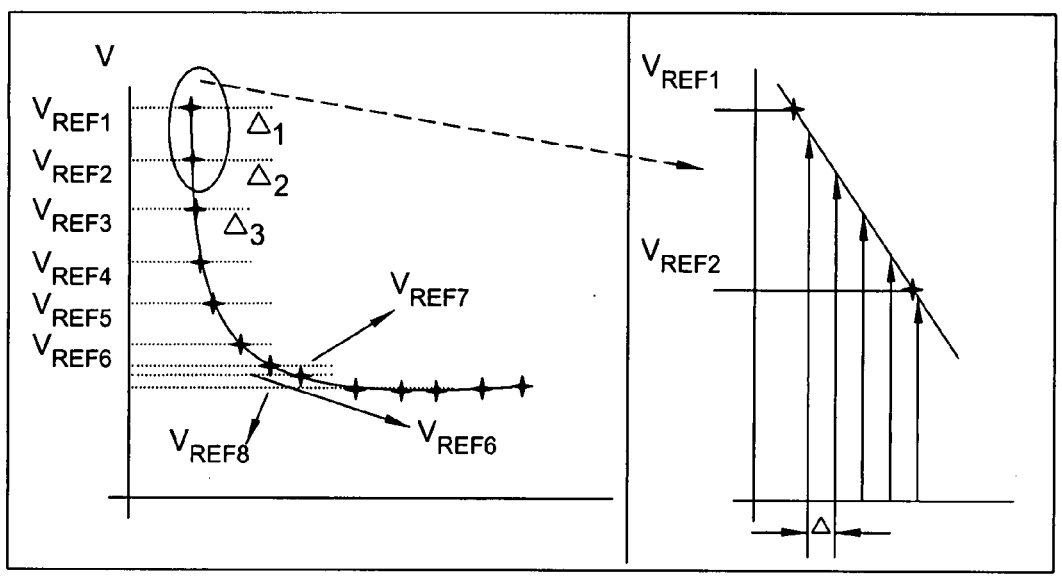
FIGS. 1A and 1B illustrate one implementation of the methodology of the present invention.
Figure 2:
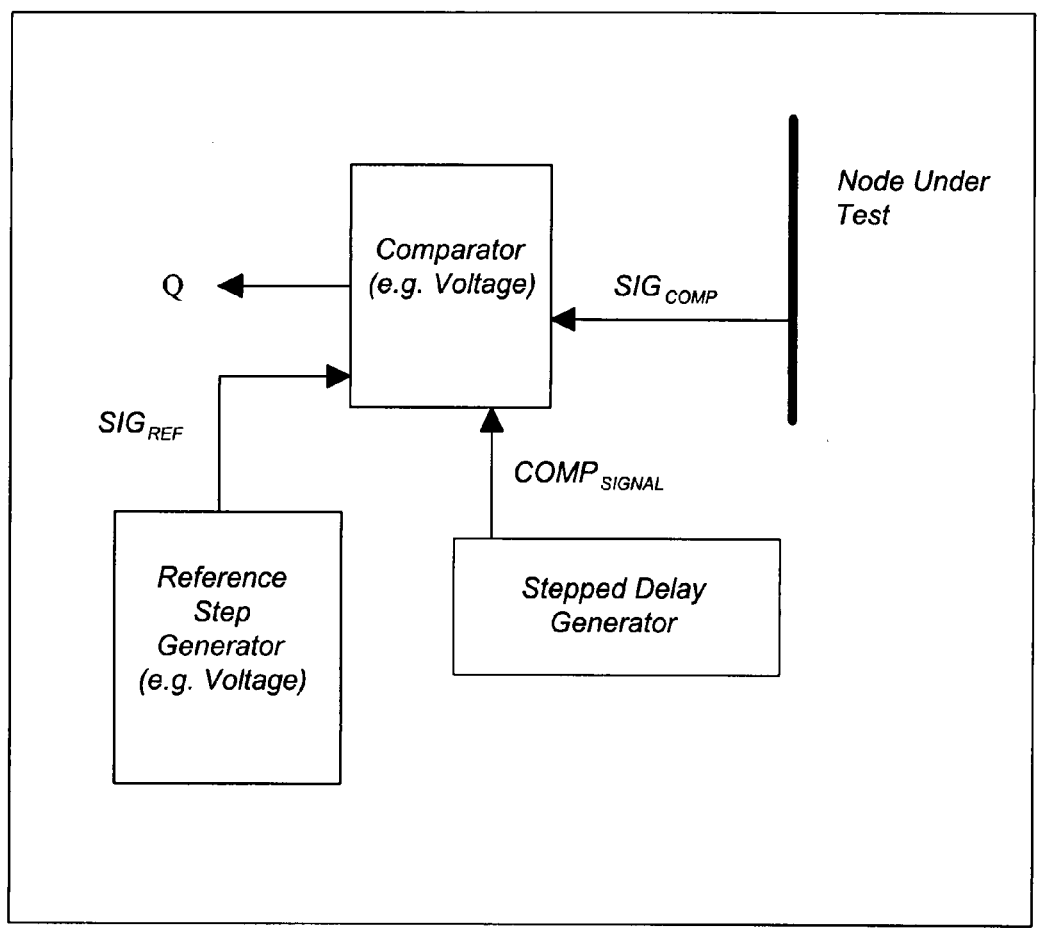
FIG. 2 illustrates a conceptual block diagram of the circuitry of the present invention.

As shown in FIGS. 1A, 1B, and 2, the proposed methodology for transient measurement makes use of a Stepped Delay Generator (SDG), a Reference Step Generator (RSG) and a Comparator. The SDG generates a programmable time delay in either fixed duration increments or increments of varying duration. The RSG similarly generates a reference signal that is programmable in fixed or varying voltage step sizes. The Comparator has two inputs and compares the generated reference voltage with the voltage appearing at a node under test at a particular time step. Let one of the inputs be $SIG_{REF}$ and the other be $SIG_{COMP}$. The comparison is done when a signal $COMP_{SIGNAL}$ arrives. There arise two conditions with respect to the Comparator:

(1) POSC is defined as the condition when
$SIG_{REF|at\ the\ latch\ time} > IG_{COMP|at\ latch\ time}$; and
(2) NOSC is defined as the condition when
$SIG_{REF|at\ the\ latch\ time} < SIG_{COMP|at\ latch\ time}$.

The Comparator produces the following outputs after the comparison at the output Q.

| Condition | Output [Q] |
|---|---|
| POSC | FALSE |
| NOSC | TRUE |

The reference signal generated by the RSG is applied to the $SIG_{REF}$ input of the Comparator. The latching signal produced by the SDG is received by the Comparator as $COMP_{SIGNAL}$. The node under test whose electrical characteristics are to be derived is connected to the $SIG_{COMP}$ input of the comparator. FIG. 1A illustrates an example of a voltage curve obtained by this method using a VSG (Voltage Step Generator) as the RSG and a voltage comparator (VC) as the Comparator.

FIG. 1B shows a magnified view of two points in FIG. 1A. The VSG generates a voltage $V_{REF1}$ that is applied to the $SIG_{REF}$ input of the VC. The $SIG_{COMP}$ input of the VC is connected to the node whose voltage is to be probed. During the operation, the SDG generates a $COMP_{SIGNAL}$ at instant t1. As shown, at instant t1, $SIG_{REF} > SIG_{COMP}$, thereby indicating operation in the POSC region. Thus, the output of the VC is FALSE. The same operation is repeated with the SDG generating $COMP_{SIGNAL}$ at time instant t2. This corresponds to the NOSC region of operation, for which, as can be seen from the above table, the output of the VC is TRUE.

The VSG now generates another voltage $V_{REF2}$ and the process is repeated. The output comparator VC now goes "TRUE" at the time instant t5. Thus, the delay between the two signals is (t5–t2), and the voltage difference between the two reference voltages is $V_{REF1}-V_{REF2}$. Using the above two values, the voltage waveform can be determined quite accurately. If the VSG generates another voltage $V_{REF3}$, the time taken to discharge between the voltages $V_{REF2}$ and $V_{REF3}$ can be determined. This logic can be extended until $V_{REF8}$. Using the above information, the voltage waveform of the node in question can be plotted. If the voltage waveform in question is linear in nature, then the discharge rate can be determined simply by taking only two reference voltages (e.g. $V_{REF1}$ and $V_{REF2}$ in the example). The discharge rate would be given as $(V_{REF1}-V_{REF2})/t_{1TRUE}-t_{2TRUE}$; where $t_{1TRUE}$=the time to get the first TRUE output from the VC for $V_{REF}=V_{REF1}$, and $t_{2TRUE}$=the time to get the first TRUE output from the VC for $V_{REF}=V_{REF2}$.

The time steps t1, t2 . . . can be calculated if the delay step is known between any two time steps. The SDG is externally programmable, thus giving the output in digital format. For example, if a two bit counter is used, and each count adds a step, then, if t1 corresponds to 01 and t2 corresponds to 11, it can be concluded that the delay between t1 and t2 is:

mod [[Decimal value (01)–Decimal Value (11)]*Δ]=
mod [1–3]*Δ=4Δ.

Similarly, the VSG is also digitally controllable. If both VSG and SDG are implemented on-chip, the step characterization can be done on-chip as explained in the following sections. This makes the entire activity process independent.

A similar methodology can be used for plotting other electrical characteristics on-chip.

A preferred embodiment of the invention consists of these major blocks
1. Latching Circuitry and Voltage Comparator (VC).
2. Stepped Delay Generator (SDG).
3. Reference Voltage Step Generator (VSG).

Figure 3:
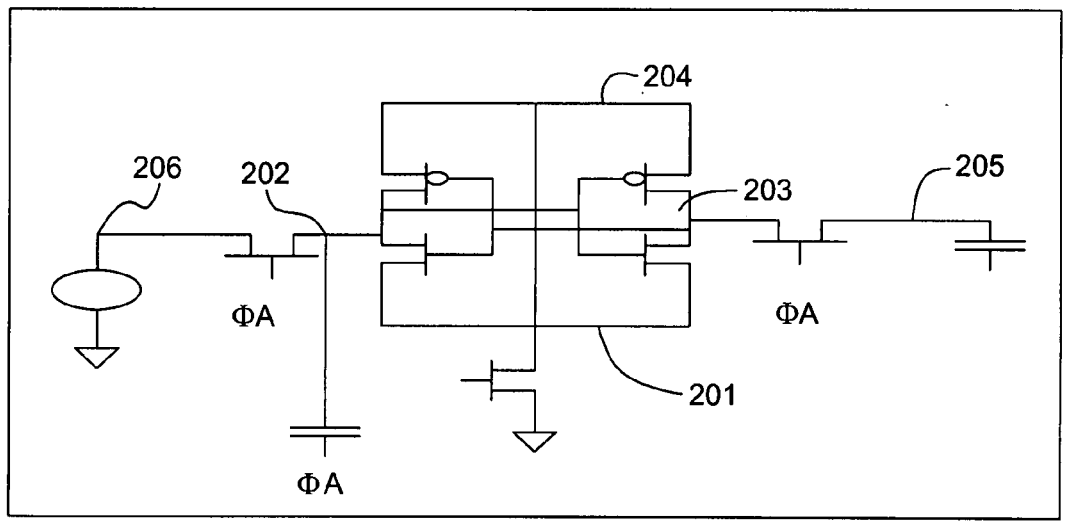
FIG. 3 illustrates a latch type voltage comparator according to an embodiment of the present invention.

FIG. 3 shows a latch type differential amplifier used for implementing the Voltage Comparator. Other types of voltage comparators can also be used. The configuration is a differential latch type sense amplifier commonly used in memories. If the latch on signal $COMP_{SIGNAL}$ of the latch amplifier is varied, the voltage appearing at the internal nodes can be controlled. When $COMP_{SIGNAL}$ is high, nodes 202 and 203 replicate nodes 206 and 205. When the $COMP_{SIGNAL}$ goes low, nodes 202 and 203 latch the external node values.

Two conditions are defined.
Let $V_{ex}$=the voltage at a node.
POSC is defined as the condition when $V_{202|at\ the\ latch\ time} > V_{203|at\ latch\ time}$; and
NOSC is defined as the condition when $V_{202|at\ the\ latch\ time} < V_{203|at\ latch\ time}$.

The following table describes the operation of the latch amplifier in the two conditions.

| Condition | Output [Q] |
|---|---|
| POSC | 1 |
| NOSC | 0 |

The capacitive element at node 205 is connected as shown in the circuit. A reference voltage is connected to node 206. At the time of the latch on signal, if the capacitor voltage is greater than the constant reference voltage, then a POSC condition arises. If, on the other hand, the capacitor voltage is less than the constant voltage, then a NOSC condition arises.

Any other voltage comparator can also be used for the same functionality as above.

Figure 4:
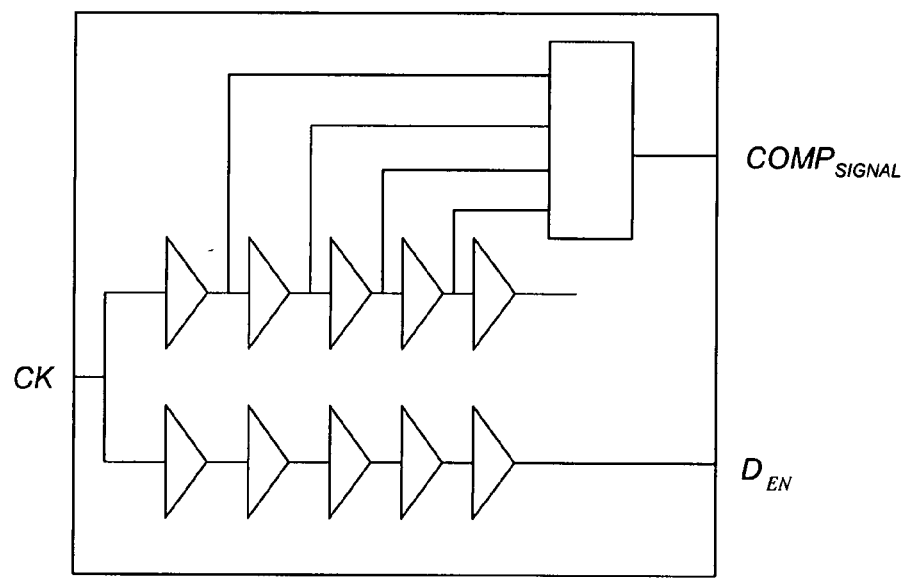
FIG. 4 illustrates an example of a SDG according to an embodiment of the present invention.

FIG. 4 shows an implementation of the stepped delay generator using a balanced buffer chain. The figure shows two buffer paths. The skew generation must be accurate as any error in the delay estimation would translate as error in the discharge rate estimation. The delay chain programs both the start of discharge of the node in question and the latch on of the voltage comaprator. $D_{EN}$ is the enable of the discharge of the DUT whose discharge rate has to be measured. CK is the clock of the circuit. Any other configuration of a delay chain can also be utilised as long as the delay of $COMP_{SIGNAL}$ can be programmed. The delay can also be generated externally or internally. The delay step generated can be characterised in the case of the on-chip SDG.

Figure 5:
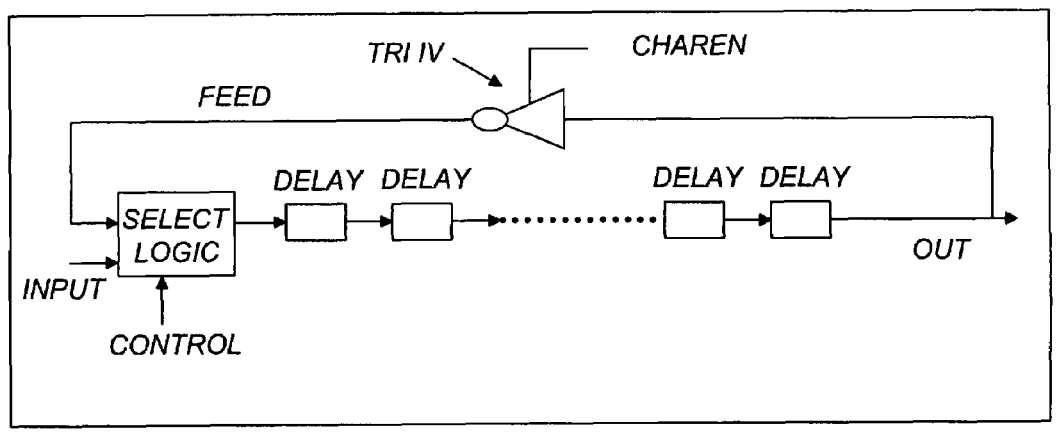
FIG. 5 illustrates the circuitry to calculate the SDG delay step according to an embodiment of the present invention.

FIG. 5 illustrates the circuitry to calculate the SDG delay step. In this example, a tri-state inverter TRI INV provides a high impedance value when its control signal CHAREN is at a low logic level. The tri-state inverter provides an inverted logic value of its input when the control signal CHAREN has a high logic level. The delay buffers are made to oscillate by connecting them in a ring. The frequency of the oscillating chain is used to calculate the delay step by the following formula. The output frequency will be directly proportional to the DELAY element. CHAREN is the "enable" signal for the chain to oscillate. OUT is the output frequency of the oscillation chain.

When signal CHAREN is low and signal CONTROL is such that the signal INPUT is passed through the SELECT LOGIC element, the circuit of FIG. 5 works as a delay chain and provides a delayed version of the signal INPUT as signal OUT. When the signal CHAREN is high and the signal CONTROL selects the signal FEED to pass through the SELECT LOGIC element, the delay chain and the tri-state inverter form a ring oscillator. The period of the ring oscillator gives the delay of the DELAY element.

The delay step is given as:

$Fosc=1/Tosc=1/(2*(N*DELAY+invDELAY+selogic DELAY))$ $Tosco=2*(N*DELAY+invDELAY+selogicDELAY)$ $DelayStep=Tosc/2.$ There would be an error in the Delay step due to the delay of the invDELAY and selLOGIC DELAY. If the delay chain was large, the above error would be very small. The calculation of delay on chip would make the delay independent of the process change.

Figure 6:
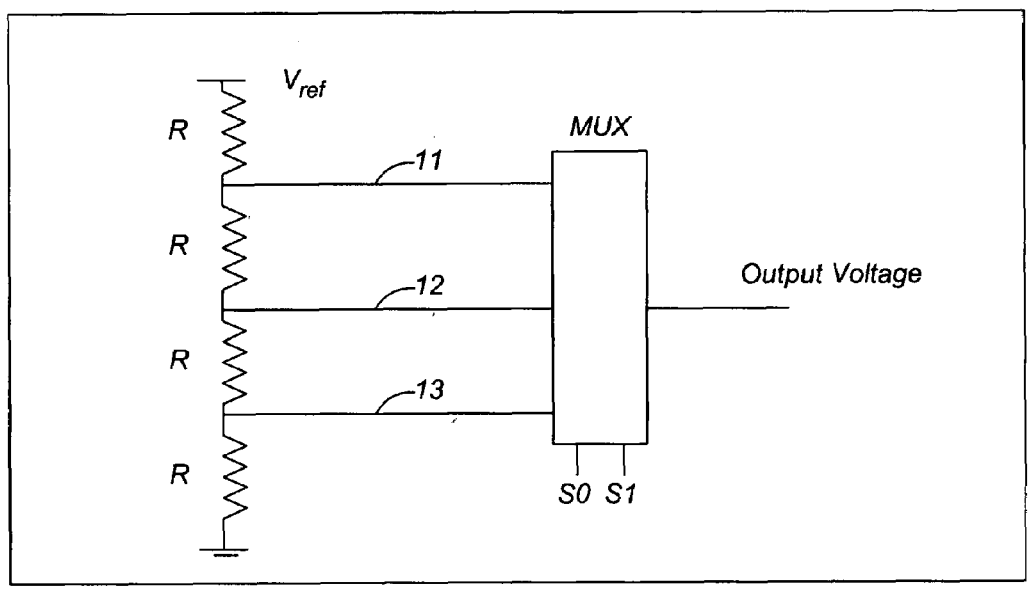
FIG. 6 illustrates an example of a VSG according to an embodiment of the present invention.

FIG. 6 shows a preferred embodiment of the Reference Voltage Generator. The reference voltage can either be taken from an external source or through an on-chip voltage generator. The voltage generator must be capable of generating stable voltages in the desired number of steps. The steps can be either programmable or constant. It must be ensured that the time taken by the capacitor to discharge from the higher voltage to the lower voltage must be greater than the minimum delay chain step.

As shown in FIG. 6, the VSG generates DC voltage steps. In this example, a chain of resistors R represents a voltage divider network that divides the voltage $V_{REF}$. A multiplexer MUX is used to select any one of the DC voltages I1, I2, and I3 produced by the chain of resistors R. The selection of the specific DC voltage depends on the values received at two select pins S0 and S1 of the multiplexer.

By controlling the select pins of the mux, various voltages can be generated. Also, by proper designing, the resistance ratio can be made constant and process independent. This makes the voltage generation independent of the process parameters. Knowing the digital values of the select pins of the mux, the voltage generated by the VSG can be calculated.

Figure 7:
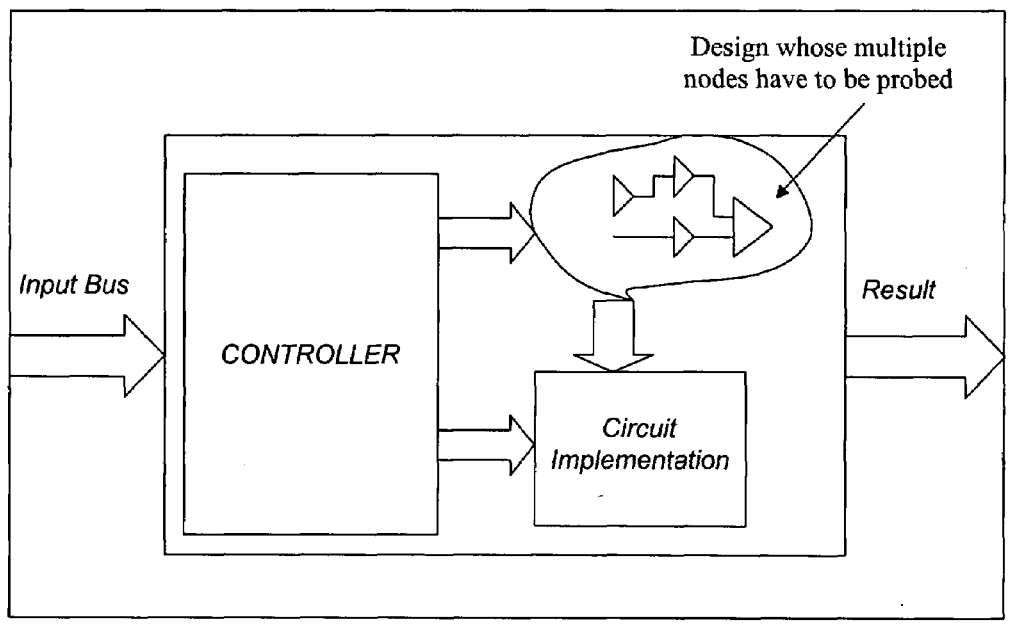
FIG. 7 illustrates the block diagram of the interface with the controller and the Node Under Test (NUT) according to an embodiment of the present invention.

FIG. 7 shows the preferred embodiment for a complete system for testing a Node Under Test (NUT). In this example, a controller applies different stimuli to the NUT. Responses to the stimuli are measured by a circuit implementation under the control of the controller. A results bus RESULT provides the necessary outputs to calculate the response of the NUT.

The whole process of characterization can be automated by using the controller. The controller varies the $COMP_{signal}$ signal until the NOSC condition is achieved. The controller then varies the reference signal. The whole process is repeated again. The outputs are in the form of the number of delay units used for delay insertion for the first case (N1) and the number of delay units used for delay insertion in the second case (N2). The delay between the two latch on signals which caused the circuit to enter the NOSC region can then be calculated from (N2−N1)*DelayStep. Also, if the reference signals are given externally, then the signal difference is known. If the reference is generated internally, then the reference signal levels will be available as analog or digital values corresponding to the two reference voltage levels. The controller probes the various nodes in the design and stores the digital results for the respective nodes. The results can then be used to probe the characteristics of the embedded nets.

Advantages of the present invention may include:
  The transition behaviour of the Node Under Test (NUT) can be extracted.
  The circuits proposed by the claimed methodology are process independent.
  The on-chip controller helps automate the process of characterization.
  A single controller can be shared between all the nodes as the frequency of operation can be as low as possible.
  The values are calculated in digital, which can be brought out serially.

It is intended that the present invention encompass such changes and modifications as fall within the scope of the appended claims.

What is claimed is:

1. An apparatus for enabling on-chip analysis of a transition behaviour of one or more embedded nets of an integrated circuit, comprising:
  a reference step generator for providing at least one of: programmable reference voltages and programmable reference currents;
  a step delay generator for providing programmable delays;
  a comparator for receiving an output of the reference step generator on a first input, an output from a node under test at a second input, and a latch enable signal from the step delay generator, and for providing a latched digital output in response to a comparison; and
  a controller for coordinating operation of the reference step generator, the step delay generator, and the comparator to provide a transient response measurement.

2. The apparatus as claimed in claim 1, further comprising an on-chip delay characterizer to analyze the programmable delays.

3. The apparatus as claimed in claim 1, wherein the reference step generator is a programmable voltage/current source.

4. The apparatus as claimed in claim 1, wherein the comparator is a differential amplifier.

5. The apparatus as claimed in claim 1, wherein the step delay generator comprises a balanced buffer chain.

6. The apparatus as claimed in claim 5, wherein the balanced buffer chain comprises a ring counter.

7. The apparatus as claimed in claim 1, wherein the transition behaviour of the one or more embedded nets is analyzed independently of a fabrication process of the integrated circuit.

8. A method for measuring a transient response of an embedded net in an integrated circuit, comprising the steps of:
   generating at least one of: a reference voltage and a reference current;
   generating programmable step delays;
   comparing an output from a circuit under test with at least one of: the reference voltage and the reference current;
   latching an output of the comparison; and
   coordinating the reference generation, step delay generation, comparison, and latching steps to provide a transient response measurement.

9. The method as claimed in claim 8, wherein the reference generation step comprises generating at least one of the reference voltage and the reference current using a programmable voltage/current source.

10. The method as claimed in claim 8, wherein the comparing step comprises comparing the output from the circuit under test with at least one of the reference voltage and the reference current using a differential amplifier.

11. The method as claimed in claim 8, wherein the step delay generation step further comprises generating the programmable step delays using a balanced buffer chain.

12. The method as claimed in claim 11, wherein the balanced buffer chain comprises delay buffers arranged in a ring.

13. A system, comprising:
    an integrated circuit comprising one or more nodes; and
    a testing apparatus comprising:
      a reference step generator capable of providing at least one of: programmable reference voltages and programmable reference currents;
      a step delay generator capable of providing programmable delays;
      a comparator capable of receiving an output of the reference step generator on a first input, an output from one of the nodes at a second input, and a latch enable signal from the step delay generator, the comparator also capable of providing a latched digital output in response to a comparison; and
      a controller capable of coordinating operation of the reference step generator, the step delay generator, and the comparator to provide a transient response measurement.

14. The system as claimed in claim 13, wherein the reference step generator comprises a programmable voltage/current source.

15. The system as claimed in claim 13, wherein the reference step generator comprises:
    a voltage divider comprising a plurality of resistors coupled in series and capable of producing multiple voltages; and
    a multiplexer capable of outputting a selected one of the voltages produced by the voltage divider.

16. The system as claimed in claim 13, wherein the comparator comprises a differential amplifier.

17. The system as claimed in claim 13, wherein the step delay generator comprises a balanced buffer chain.

18. The system as claimed in claim 17, wherein the balanced buffer chain comprises delay buffers arranged in a ring.

19. The system as claimed in claim 13, wherein the controller is capable of providing a transient response measurement for each of a plurality of nodes in the integrated circuit.

20. The system as claimed in claim 19, wherein the controller is further capable of outputting the transient response measurements.

* * * * *

UNITED STATES PATENT AND TRADEMARK OFFICE
CERTIFICATE OF CORRECTION

PATENT NO. : 7,248,066 B2
APPLICATION NO. : 11/025854
DATED : July 24, 2007
INVENTOR(S) : Ruchir Saraswat, Balwant Singh and Prashant Dubey It is certified that error appears in the above-identified patent and that said Letters Patent is hereby corrected as shown below:

Column 3, line 29, delete "$SIG_{REF|at\ the\ latch\ time} > IG_{COMP|at\ latch\ time}$" and replace with --$SIG_{REF|at\ the\ latch\ time} > SIG_{COMP|at\ latch\ time}$--;

Column 6, line 61, claim 1, delete "a" and replace with --an on-chip--;

Column 7, line 11, claim 8, delete "a" and replace with --an on-chip--;

Column 7, line 17, claim 8, insert --in response to the programmable step delay-- after the term "test";

Column 7, line 37, claim 13, insert --for on-chip transient response-- after the term "system,";

Column 8, line 12, claim 13, delete "a" and replace with --an on-chip--.

Signed and Sealed this

Twenty-seventh Day of November, 2007

JON W. DUDAS
*Director of the United States Patent and Trademark Office*